United States Patent [19]
Kato et al.

[11] Patent Number: 5,661,835
[45] Date of Patent: Aug. 26, 1997

[54] OPTICAL COMPOSITE MODULE AND METHOD OF ASSEMBLING THE SAME

[75] Inventors: Takashi Kato; Hisao Go; Toshio Takagi, all of Yokohama, Japan

[73] Assignee: Sumitomo Electric Industries, Ltd., Osaka, Japan

[21] Appl. No.: 588,328

[22] Filed: Jan. 18, 1996

[30] Foreign Application Priority Data

Jan. 19, 1995 [JP] Japan ................................ 7-006332

[51] Int. Cl.$^6$ ............................................... G02B 6/36
[52] U.S. Cl. ........................ 385/92; 385/33; 385/93; 385/47; 385/89
[58] Field of Search ........................ 385/47, 36, 37, 385/33, 34, 35, 88, 89, 92, 93

[56] References Cited

U.S. PATENT DOCUMENTS

| | | | |
|---|---|---|---|
| 4,995,696 | 2/1991 | Nishimura et al. | 350/96.2 |
| 5,345,373 | 9/1994 | Tanida | 362/455 |
| 5,355,249 | 10/1994 | Souda et al. | 385/47 |
| 5,485,538 | 1/1996 | Bowen et al. | 385/92 |

OTHER PUBLICATIONS

Naganuma et al, "Optical Module with Flat Wavelength Characteristics for Er-Doped Fiber Amplifiers", Optical Amplifiers and Their Applications, 1993 Technical Diges Series, vol. 14, pp. 234–237.

*Primary Examiner*—John Ngo
*Attorney, Agent, or Firm*—Cushman Darby & Cushman IP Group of Pillsbury Madison & Sutro, LLP

[57] ABSTRACT

An optical composite module includes a housing having two opposing side surfaces, a light separating unit disposed in the housing and adapted to separate pumping light and signal light, optical fibers respectively mounted on the opposing side surfaces of the housing to cause the signal light to pass through the light separating unit on a substantially straight line, and a pumping light source unit disposed in the housing and adapted to cause the pumping light to be incident on the light separating unit. This optical composite module can reduce a loss of light and improve the utilization efficiency of pumping light.

8 Claims, 16 Drawing Sheets

OPTICAL COMPOSITE MODULE AND METHOD OF ASSEMBLING THE SAME

BACKGROUND OF THE INVENTION

1. Field of the Invention

The present invention relates to an optical composite module and a method of assembling the same and, more particularly, to an optical composite module having a pumping module for an optical amplifier doped with a rare earth element and used for optical communication and to a method of assembling the same.

2. Related Background Art

Conventionally, optical transmission using WDM (Wavelength Division Multiplexing) and optical fiber amplifiers require optical parts having optical multiplexing and demultiplexing functions and the like. Various optical modules having these functions have been developed and commercially available. In many cases, multiplexing and demultiplexing functions are realized by dielectric multilayered films formed on prisms or optical plates. The transmission or reflection characteristics of such a dielectric multilayered film are depend on the incident angle of light. For this reason, a prism or an optical plate must be disposed with a high angle precision (almost ±0.2° to 1.0°) in an optical module.

As an optical fiber mounted on an optical module, a single mode fiber having a core diameter of about 10 μm is often used. For this reason, in cases of optically coupling optical fibers to each other by an optical module, or optically coupling an optical fiber and a light-emitting element or a light-receiving element, they must be coupled to each other via a lens. A large optical loss occurs, and the predetermined performance of the optical module may not be obtained unless these optical parts, i.e., the optical fiber, the lens, the light-emitting element, the light-receiving element, and the like are mounted in the optical module with high-precision alignment (optical axis adjustment) on the micron or submicron order.

In consideration of long-term reliability after the assembly of the optical module, a highly reliable fixing technique is required to assemble parts with a high precision alignment. In many cases, after an optical fiber, a lens, a light-emitting element, a light-receiving element, and the like are mounted in metal housing, the parts are fixed to a metal housing by YAG laser welding.

FIG. 23 shows the arrangement of a conventional bidirectional pumping optical fiber amplifier. Referring to FIG. 23, an optical fiber amplifier is generally assembled by connecting the fiber pigtails of discrete optical parts such as an optical demultiplexing coupler 100, a WDM coupler 101, an optical isolator 102, an EDF (Erbium Doped Fiber) 103, and a pumping LD (laser diode) module 104 by fusion splicing. Note that input and output monitors 105 and 106 constituted by PDs (photodiodes) are connected to the optical demultiplexing coupler 100.

According to such an optical fiber amplifier, the overall loss of light in the amplifier is large, and a predetermined performance cannot be obtained unless losses in the respective optical parts and the fusion-spliced portions are finely managed. Although various attempts have been made to dispose a prism or an optical plate with a high angle precision, problems have been occurred in terms of mass production and cost because occurred process and assembly techniques are required.

FIG. 24 is a schematic view showing a pumping module located on the rear stage of a conventional optical fiber amplifier, which is disclosed in, e.g., Japanese Patent Laid-Open No. 4-12728. This module corresponds to the broken line portion in FIG. 23. Referring to FIG. 23, an EDF (not shown) doped with a rare earth element such as Er (erbium) is mounted on an optical fiber 6a connected to a portion of an optical separating unit 36 which is located on the left side in FIG. 23. A pumping light source 20 incorporating a semiconductor laser (not shown) is connected to the optical separating unit 36 via an optical fiber 6c. Note that the pumping light source 20 has a terminal 40 for electrical connection to an external unit.

The optical separating unit 36 incorporates a multiplexer 3 for multiplexing transmitted signal light and pumping light from the pumping light source 20, an optical isolator 4 for allowing only light propagating in one direction and blocking light propagating in the opposite direction, and a beam splitter 7 for branching pumping light and causing the resultant light to be incident on a photodiode 8. Note that the optical fibers 6a to 6c are respectively connected to lens holders 44a to 44c via ferrules 41a to 41c. The lens holders 44a to 44c respectively hold lenses 42a to 42c.

When such a conventional pumping module is used, since the pumping light source 20 and the optical separating unit 36 are separately arranged, pumping light from a semiconductor laser is caused to emerge to the optical fiber 6c first and is then collimated to be incident on the optical separating unit 36. Consequently, a large optical loss occurs, and it is not easy to supply the pumping light to the EDF while maintaining a sufficient intensity. In addition, various attempts have been made to realize the functions of a plurality of such optical parts using a single optical module. However, no optical module has reached a satisfactory level in terms of mass production and cost.

SUMMARY OF THE INVENTION

The present invention has been made to solve the above problems, and has as its object to provide an optical composite module which reduces an optical loss and improves the utilization efficiency of pumping light. It is another object of the present invention to provide an optical composite module which can set the angle of an optical member with high precision, and a method of assembling the same.

According to one aspect of the present invention, there is provided an optical composite module comprising:

a housing having two opposing side surfaces;

a light separating unit disposed in the housing for separating pumping light and signal light;

optical fibers respectively mounted on the opposing side surfaces of the housing to cause the signal light to pass through the light separating unit on a substantially straight line; and a pumping light source unit disposed in the housing for subjecting the pumping light to incident on the light separating unit.

According to another aspect of the present invention, there is provided an optical composite module comprising:

a housing having two opposing side surfaces;

an optical adding unit disposed in the housing for adding pumping light to signal light;

optical fibers respectively mounted on the opposing side surfaces of the housing to cause the signal light to pass through the optical adding unit on a substantially straight line; and a pumping light source unit disposed in the housing for subjecting the pumping light to incident on the optical adding unit.

According to still another aspect of the present invention, there is provided an optical composite module comprising:

a metal optical base having a recess portion in which a carrier portion is formed, and a flat plate portion, the base being formed by injection molding;

an optical member held in a groove formed in the carrier portion;

optical fibers respectively mounted on opposing side surfaces of the recess portion to cause the signal light to pass therethrough on a substantially straight line; and a light-emitting element disposed on the flat plate portion for emitting pumping light toward the signal light.

According to still another aspect of the present invention, there is provided a method of assembling an optical composite module, comprising the steps of:

forming a metal optical composite module by injection molding, the module having a recess portion in which a carrier portion having a groove is formed, and a flat plate portion;

inserting an optical member in the groove;

mounting a light-emitting element for emitting pumping light on the flat plate portion; and mounting optical fibers in holes formed in opposing side surfaces of the recess portion to cause signal light to pass therethrough on a substantially straight line.

According to the present invention, the light separating unit and the pumping light source unit are disposed in the same housing. In this arrangement, since emitted pumping light is directly supplied to the EDF via the light separating unit, the utilization efficiency of the pumping light can be improved. In addition, the apparatus can be made compact, and hence is easy to handle. Furthermore, since the number of optical isolators 59 can be decreased, the apparatus can be manufactured at a low cost.

Since the optical base formed by injection molding of a metal is used, the angle of an optical member can be set with high precision. For this reason, it suffices that a dielectric film formed on the surface of the optical member ensures predetermined characteristics only within a limited incident angle range. Consequently, an increase in the yield of the optical member and a decrease in the cost thereof can be attained. If an optical base is made of a material having a proper thermal conductivity and proper rigidity, the flat plate portion serves to sink heat from the light-emitting element. In addition, since the flat plate portion is used as part of the optical base, the overall optical base can be expected to serve as a heat sink having a relatively large capacity. Furthermore, if a light-emitting element and an optical fiber or an optical member are mounted on an optical base having high rigidity, a large optical coupling loss due to deformation caused by an external force can be prevented.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will be apparent to those skilled in the art from this detailed description.

DESCRIPTION OF THE PREFERRED EMBODIMENTS

Figure 1:
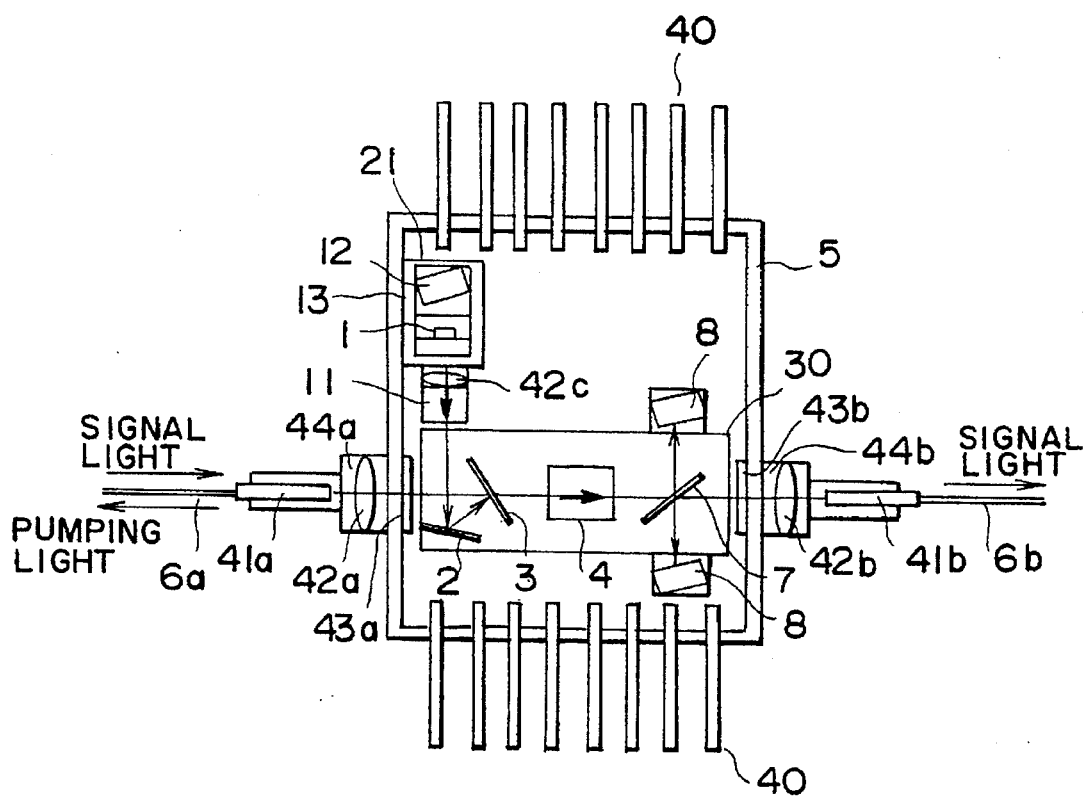
FIG. 1 is a schematic view showing an optical composite module according to the first embodiment of the present invention.

The preferred embodiments of the present invention will be described below with reference to the accompanying drawings. The same reference numerals denote the same or corresponding parts throughout the drawings, and a repetitive description will be avoided.

[First Embodiment]

FIG. 1 is a schematic view showing an optical composite module according to the first embodiment of the present invention. Each of FIGS. 1 to 7 shows a pumping module for an optical amplifier. This pumping module supplies pumping light to a fiber (not shown) doped with a rare earth element such as Er and disposed on the rear stage, and allows signal light amplified by the rare earth element doped fiber to pass through.

Referring to FIG. 1, a square or rectangular housing 5 having two opposing side surfaces, on which optical fibers 6a and 6b are mounted, includes a pumping light source unit 21 and a light separating unit 30 for separating pumping light and signal light. The pumping module receives signal light from the optical fiber 6a mounted on one side surface of the housing 5, and allows the light to pass through straight toward the optical fiber 6b mounted on the other side surface via the light separating unit 30. The pumping light source unit 21 is disposed such that pumping light emitted therefrom is incident from a direction perpendicular to the traveling direction of signal light passing through the light separating unit 30. The pumping light incident on the light separating unit 30 is transmitted in an opposite direction to the traveling direction of the signal light.

In this case, the housing 5 is integrally formed by cutting or molding of a member consisting of a metal, e.g., SUS (stainless steel), or a hard plastic material. The housing 5 has terminals 40 for electrical connections to an external unit. The optical fibers 6a and 6b are respectively connected to lens holders 44a and 44b holding lenses 42a and 42b via ferrules 41a and 41b. Windows 43a and 43b are formed in the side surfaces of the housing 5 which are adjacent to the lens holders 44a and 44b.

The pumping light source unit 21 includes a photodiode 12 and a semiconductor laser 1. The temperature around the semiconductor laser 1 is controlled by a temperature controller 13 such as a Peltier element to prevent variations in optical output power and wavelength due to heat generated by the laser. The pumping light source unit 21 also includes a lens 42c and an optical isolator 11 for allowing light to pass through in only the direction indicated by the arrow.

The light separating unit 30 includes an optical isolator 4, a mirror 2 for reflecting light, and a multiplexer 3 for allowing signal light to pass through and reflecting pumping light. These members, i.e., the multiplexer 3 and the optical isolator 4, are arranged along the traveling direction of signal light. Pumping light emitted from the pumping light source unit 21 is reflected by the mirror 2 and the multiplexer 3 and propagate in an opposite direction (from right to left in FIG. 1) to signal light having passed through the multiplexer 3.

With this arrangement, since pumping light emitted from the semiconductor laser 1 is directly incident on the light separating unit 30 without the optical fiber 6c, unlike in the conventional arrangement, the optical coupling loss is reduced. In addition, since the pumping light source unit 21 is incorporated in the housing 5, the module is easy to handle. Furthermore, according to the optical composite module of the present invention, the pumping light source unit 21 is disposed such that pumping light emitted therefrom is incident from a direction perpendicular to the composite module is easy to assemble.

[Second Embodiment]

Figure 2:
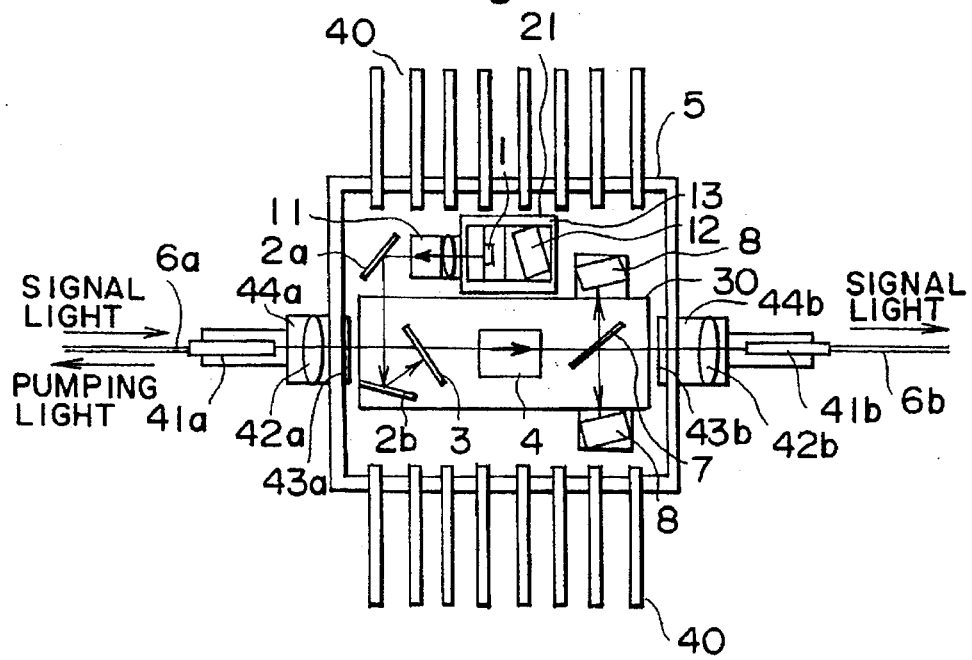
FIG. 2 is a schematic view showing an optical composite module according to the second embodiment of the present invention.

FIG. 2 is a schematic view showing an optical composite module according to the second embodiment of the present invention. The basic arrangement in FIG. 2 is the same as that in FIG. 1, but is different therefrom in that a pumping light source unit 21 is disposed in a housing 5 to cause pumping light emitted from the pumping light source unit 21 to travel parallel (opposite direction) to the traveling direction of signal light. Pumping light emitted from the pumping light source unit 21 is reflected by a mirror 2a to be incident on a light separating unit 30 from a direction perpendicular to the traveling direction of signal light. With this arrangement, a compact optical composite module can be assembled.

[Third Embodiment]

Figure 3:
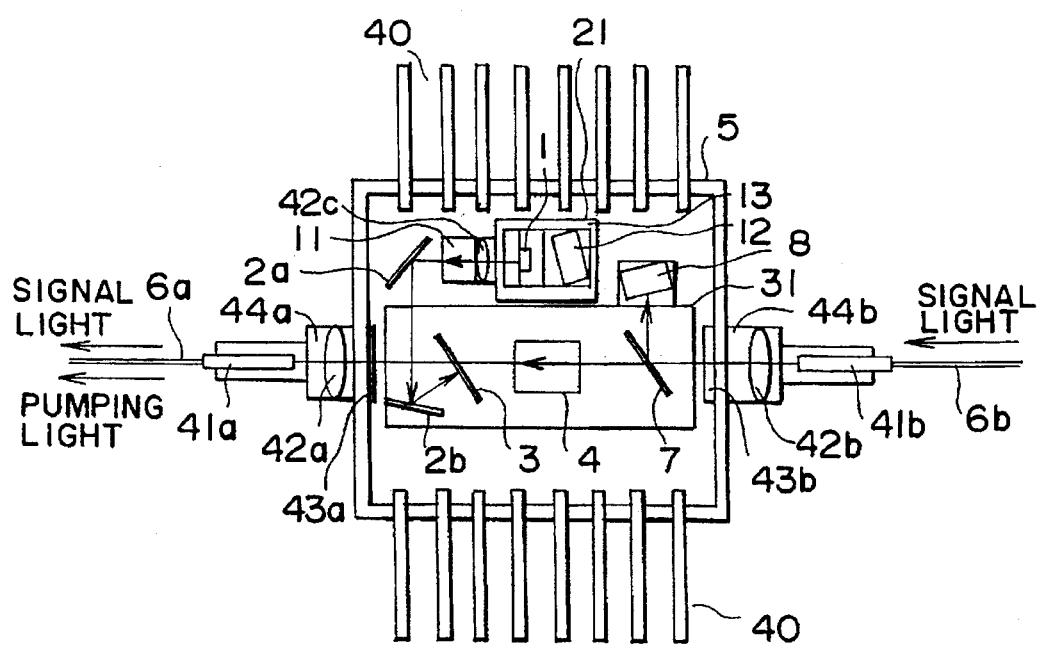
FIG. 3 is a schematic view showing an optical composite module according to the third embodiment of the present invention.

FIG. 3 is a schematic view showing an optical composite module according to the third embodiment of the present invention. This optical composite module supplies pumping light to a fiber (not shown) doped with a rare earth element such as Er and disposed on the front stage. Note that the above arrangement, i.e., disposing of the rare earth element doped fiber on the front stage, is also used in the following embodiments to be described with reference to FIGS. 4, 5, and 6.

Referring to FIG. 3, a square or rectangular housing 5 having two opposing side surfaces, on which optical fibers 6a and 6b are respectively mounted, includes a pumping light source unit 21 and a optical adding unit 31 for multiplexing pumping light and signal light. The optical composite module receives signal light from the optical fiber 6b mounted on one side surface of the housing 5, and allows the light to pass through straight toward the optical fiber 6a mounted on the other side surface via the optical adding unit 31. The pumping light source unit 21 is disposed such that pumping light emitted therefrom travels parallel to the traveling direction of signal light. Pumping light emitted from the pumping light source unit 21 is reflected by a mirror 2a to be incident on the optical adding unit 31 from a direction perpendicular to the traveling direction of signal light. The incident pumping light is then reflected by a mirror 2b to be transmitted in the same direction as the traveling direction of the signal light by a multiplexer 3. In this case, the optical adding unit 31 includes at least an optical isolator 4, the multiplexer 3, and the mirror 2b. The optical isolator 4 and the multiplexer 3 are arranged along the traveling direction of the signal light (from right to left in FIG. 3).

With this arrangement, since pumping light emitted from the semiconductor laser 1 is directly incident on the optical adding unit 31 without the optical fiber 6c, unlike in the conventional arrangement, the optical coupling loss is reduced. In addition, since the pumping light source unit 21 is incorporated in the housing 5, the module is easy to handle. Pumping light emitted from the pumping light source unit 21 is reflected by a mirror 2a to be incident on the light separating unit 31 from a direction perpendicular to the traveling direction of signal light. With this arrangement, a compact optical composite module can be assembled.

[Fourth Embodiment]

Figure 4:
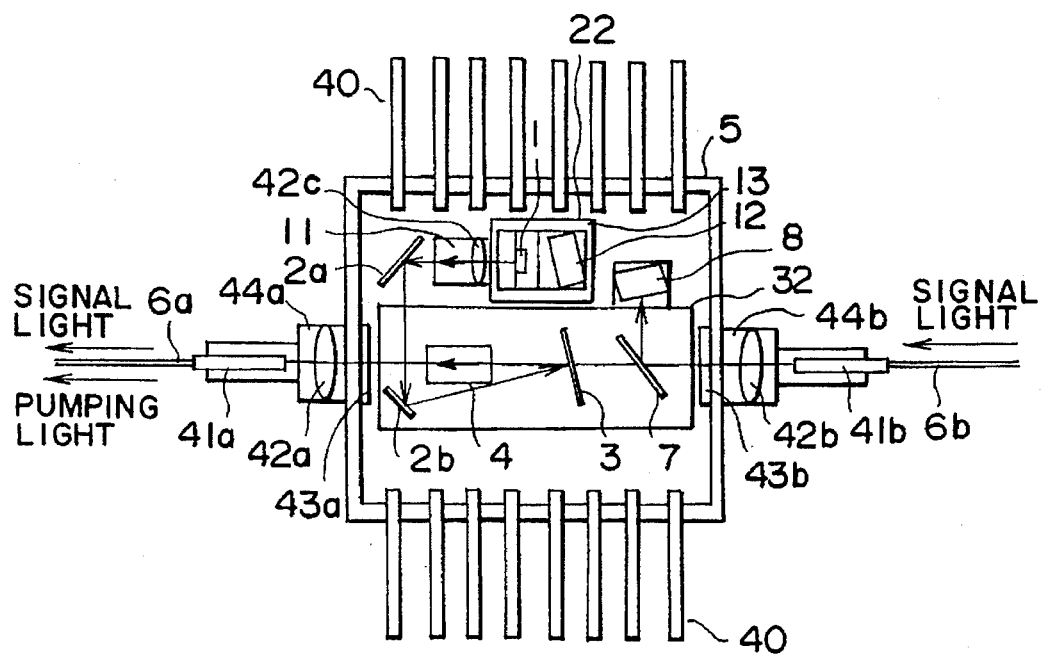
FIG. 4 is a schematic view showing an optical composite module according to the fourth embodiment of the present invention.

FIG. 4 is a schematic view showing an optical composite module according to the fourth embodiment of the present invention. This optical composite module supplies pumping light to a fiber (not shown) doped with a rare earth element such as Er and disposed on the front stage.

Referring to FIG. 4, a square or rectangular housing 5 having two opposing side surfaces, on which optical fibers 6a and 6b are respectively mounted, includes a pumping light source unit 22 and an optical adding unit 32 for multiplexing pumping light and signal light. The optical composite module receives signal light from the optical fiber 6b mounted on one side of the housing 5, and allows the light to pass through straight toward the optical fiber 6a mounted on the other side of the housing 5 via the optical adding unit 32. The pumping light source unit 22 is disposed such that pumping light emitted therefrom travels parallel to the traveling direction of signal light. Pumping light emitted from the pumping light source unit 22 is reflected by a mirror 2a to be incident on the optical adding unit 32 from a direction perpendicular to the traveling direction of signal light. The incident pumping light is reflected by a mirror 2b to be transmitted in the same direction as the traveling direction of the signal light by the multiplexer 3.

The pumping light source unit 22 includes a semiconductor laser 1 and a photodiode 12 disposed therebehind. The temperature around the semiconductor laser 1 is controlled by a temperature controller 13. The optical adding unit 32 includes at least an optical isolator 4, the mirror 2b, and a multiplexer 3. Note that the multiplexer 3 and the optical isolator 4 are arranged along the traveling direction of signal light (from right to left in FIG. 4).

With this arrangement, even if amplified signal light is reflected, the light is sufficiently attenuated by the optical isolator 4. For this reason, the optical isolator 11 in the pumping light source unit 22 can be omitted. Therefore, the arrangement of the optical composite module can be simplified, and a reduction in cost can be attained.

[Fifth Embodiment]

Figure 5:
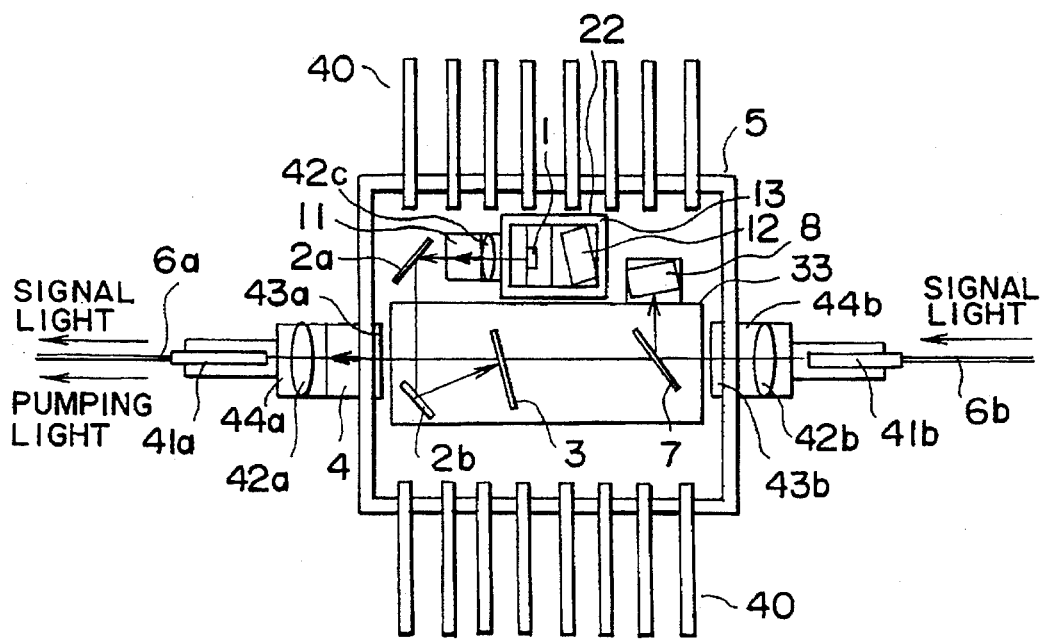
FIG. 5 is a schematic view showing an optical composite module according to the fifth embodiment of the present invention.

FIG. 5 is a schematic view showing an optical composite module according to the fifth embodiment of the present invention. Referring to FIG. 5, a square or rectangular housing 5 having two opposing side surfaces, on which optical fibers 6a and 6b are respectively mounted, includes a pumping light source unit 22 and a optical adding unit 33 for multiplexing pumping light and signal light. The optical composite module receives signal light from the optical fiber 6b mounted on one side surface of the housing 5, and allows the light to pass straight toward the optical fiber 6a mounted on the other side surface via the optical adding unit 33. The pumping light source unit 22 is disposed such that pumping light emitted therefrom travels parallel to the traveling direction of signal light.

Pumping light emitted from the pumping light source unit 22 is reflected by a mirror 2a to be incident on the optical adding unit 33 from a direction perpendicular to the traveling direction of signal light. The incident pumping light is reflected by a mirror 2b and is multiplexed with signal light by a multiplexer 3. The light is then transmitted in the same direction as the traveling direction of the signal light. An optical isolator 4 is disposed on an optical axis between a side surface of the housing 5 and a lens holder 44a. In this case, the pumping light source unit 22 includes a semiconductor laser 1 and a photodiode 12 disposed therebehind. The temperature around the semiconductor laser 1 is controlled by a temperature controller 13. The optical adding unit 33 includes at least the mirror 2b and the multiplexer 3. The multiplexer 3 is disposed on the optical path of signal light.

With this arrangement, the optical isolator 4 can be omitted from the pumping light source unit 22 and the optical adding unit 33. Therefore, the arrangement of the optical composite module can be simplified, and a reduction in cost can be attained.

[Sixth Embodiment]

Figure 6:
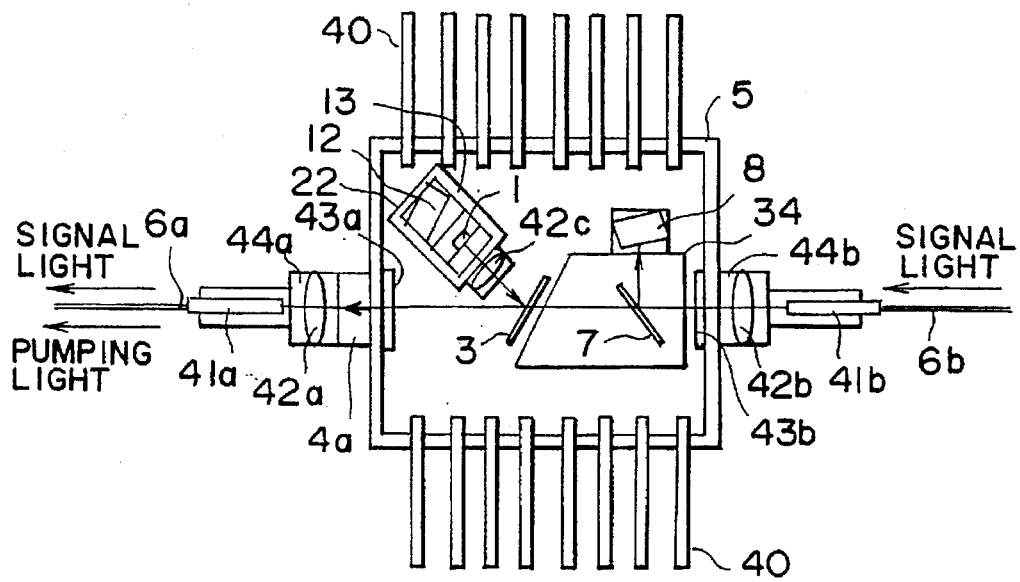
FIG. 6 is a schematic view showing an optical composite module according to the-sixth embodiment of the present invention.

FIG. 6 is a schematic view showing an optical composite module according to the sixth embodiment of the present invention. In each of the optical composite modules in FIGS. 6 and 7, the pumping light source unit is disposed with an inclination with respect to the traveling direction of signal light to decrease the number of components.

Referring to FIG. 6, a square or rectangular housing 5 having two opposing side surfaces, on which optical fibers 6a and 6b are respectively mounted, includes a pumping light source unit 22 and an optical adding unit 34 for multiplexing pumping light and signal light. The optical composite module receives signal light from the optical fiber 6a mounted on one side surface of the housing 5, and allows the light to pass straight toward the optical fiber 6b mounted on the other side surface via the optical adding unit 34. The pumping light source unit 22 is disposed such that pumping light emitted therefrom travels obliquely with respect to the traveling direction of signal light. More specifically, pumping light emitted from the pumping light source unit 22 is incident on the optical adding unit 34 with an inclination with respect to the traveling direction of signal light. The incident pumping light is reflected and multiplexed with the signal light by a multiplexer 3 to be transmitted in the same direction as the traveling direction of the signal light. An optical isolator 4 is disposed on an optical axis between a side surface of the housing 5 and a lens holder 44a.

In this case, the pumping light source unit 22 includes a semiconductor laser 1 and a photodiode 12 disposed therebehind. The temperature around the semiconductor laser 1 is controlled by a temperature controller 13. The optical adding unit 34 includes at least the multiplexer 3. The multiplexer 3 is disposed on the optical path of signal light with an inclination with respect to the signal light. Pumping light emitted from the pumping light source unit 22 is reflected by the multiplexer 3, and is multiplexed with the signal light, which has passed through the multiplexer 3, by the multiplexer 3. The resultant light then passes through the optical isolator 4 in the same direction (from right to left in FIG. 6) as the traveling direction of the signal light. With this arrangement, the sixth embodiment has the same function as that of the fifth embodiment without using any mirror. The optical composite module can therefore be made compact.

[Seventh Embodiment]

Figure 7:
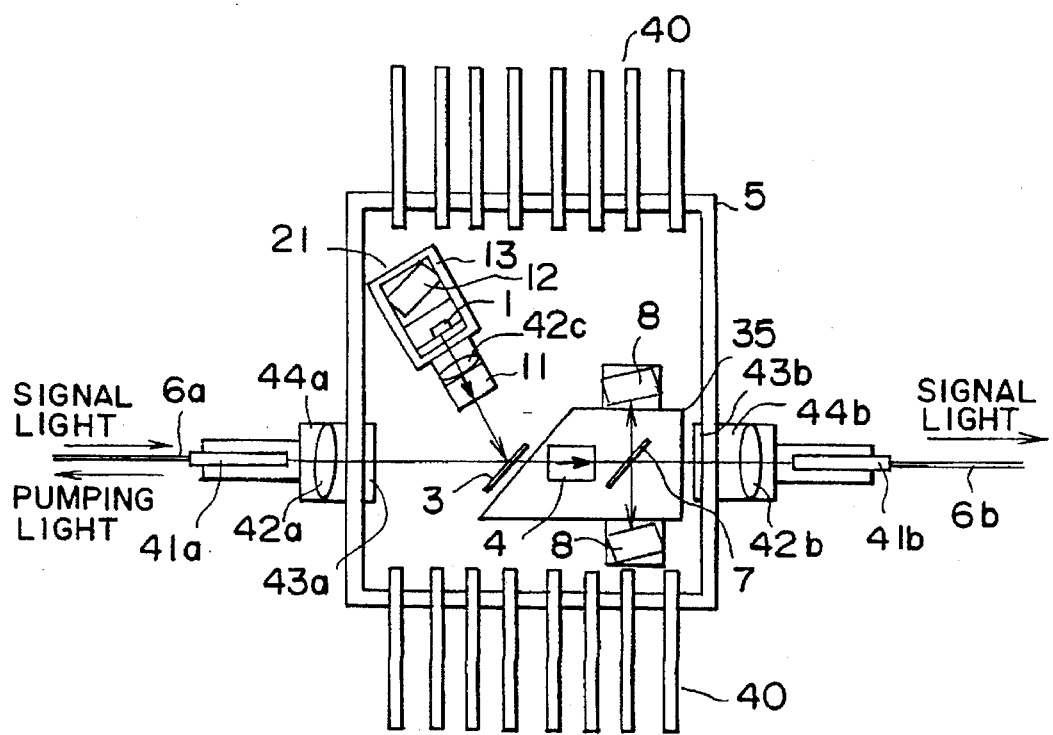
FIG. 7 is a schematic view showing an optical composite module according to the seventh embodiment of the present invention.

FIG. 7 is a schematic view showing an optical composite module according to the seventh embodiment of the present invention. This optical composite module supplies pumping light to a fiber doped with a rare earth element such as Er and disposed on the rear stage, and allows signal light amplified by the rare earth doped fiber to pass through.

Referring to FIG. 7, a square or rectangular housing 5 having two opposing side surfaces, on which optical fibers 6a and 6b are respectively mounted, includes a pumping light source unit 21 and a light separating unit 35 for separating pumping light and signal light. The optical composite module receives signal light from the optical fiber 6a mounted on one side surface of the housing 5, and allows the light to pass straight toward the optical fiber 6b mounted on the other side surface via the light separating unit 35. The pumping light source unit 21 is disposed such that pumping emitted therefrom travels obliquely with respect to the traveling direction of signal light. Pumping light emitted from the pumping light source unit 21 is incident on the light separating unit 35 with an inclination with respect to the traveling direction of signal light. The incident pumping is reflected by a multiplexer 3, and is caused to emerge so as to be transmitted in an opposite direction to the traveling direction of the signal light.

In this case, the pumping light source unit 21 includes a semiconductor laser 1 and a photodiode 12 disposed therebehind. The temperature around the semiconductor laser 1 is controlled by a temperature controller 13. The light separating unit 35 includes at least an optical isolator 4 and the multiplexer 3. The multiplexer 3 and the optical isolator 4 are arranged along the traveling direction of signal light. The multiplexer 3 is disposed with an inclination with respect to the signal light. Pumping light emitted from the pumping light source unit 21 is reflected by the multiplexer 3 and propagates in an opposite direction (from right to left in FIG. 7) to the signal light having passed through the multiplexer 3. With this arrangement, the seventh embodiment has the same function as that of the first and second embodiments without using any mirror. The optical composite module can therefore be made compact.

Note that in the embodiments described above, a beam splitter 7 and a photodiode 8 may be arranged in the optical path of signal light in the light separating unit 30, the light separating unit 35, and the optical adding units 31 to 34. A signal level can be monitored by the photodiode 8 so that the optical composite module can be smoothly operated.

[Eighth Embodiment]

Figure 8:
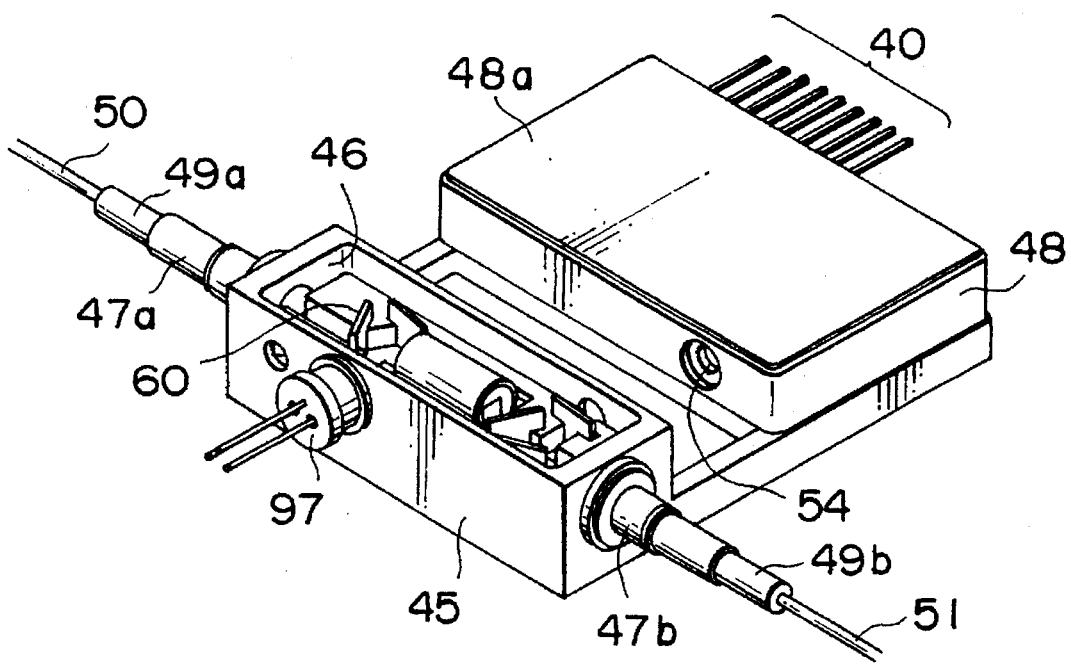
FIG. 8 is a perspective view showing an optical composite module according to the eighth embodiment of the present invention.
Figure 9:
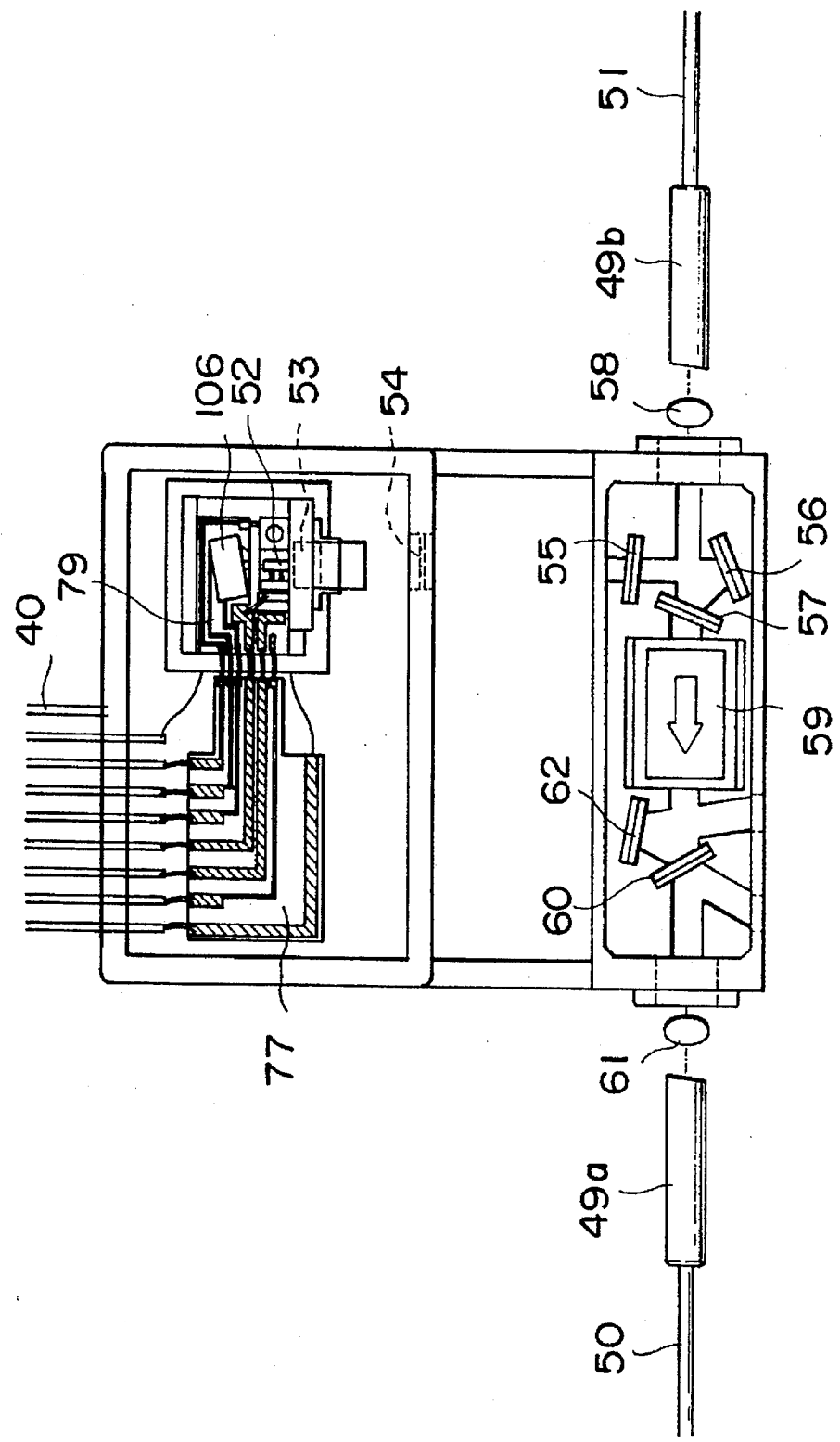
FIG. 9 is a schematic plan view showing the optical composite module according to the eighth embodiment of the present invention.
Figure 23:
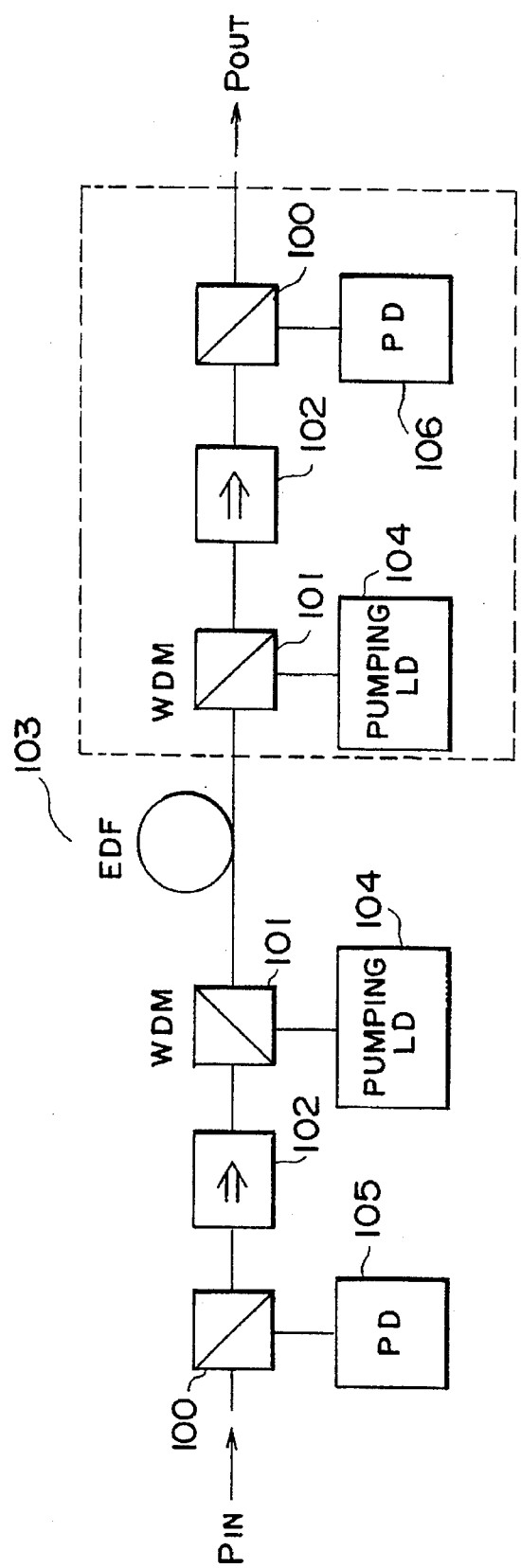
FIG. 23 is a block diagram showing a conventional bidirectional pumping optical fiber amplifier.
Figure 24:
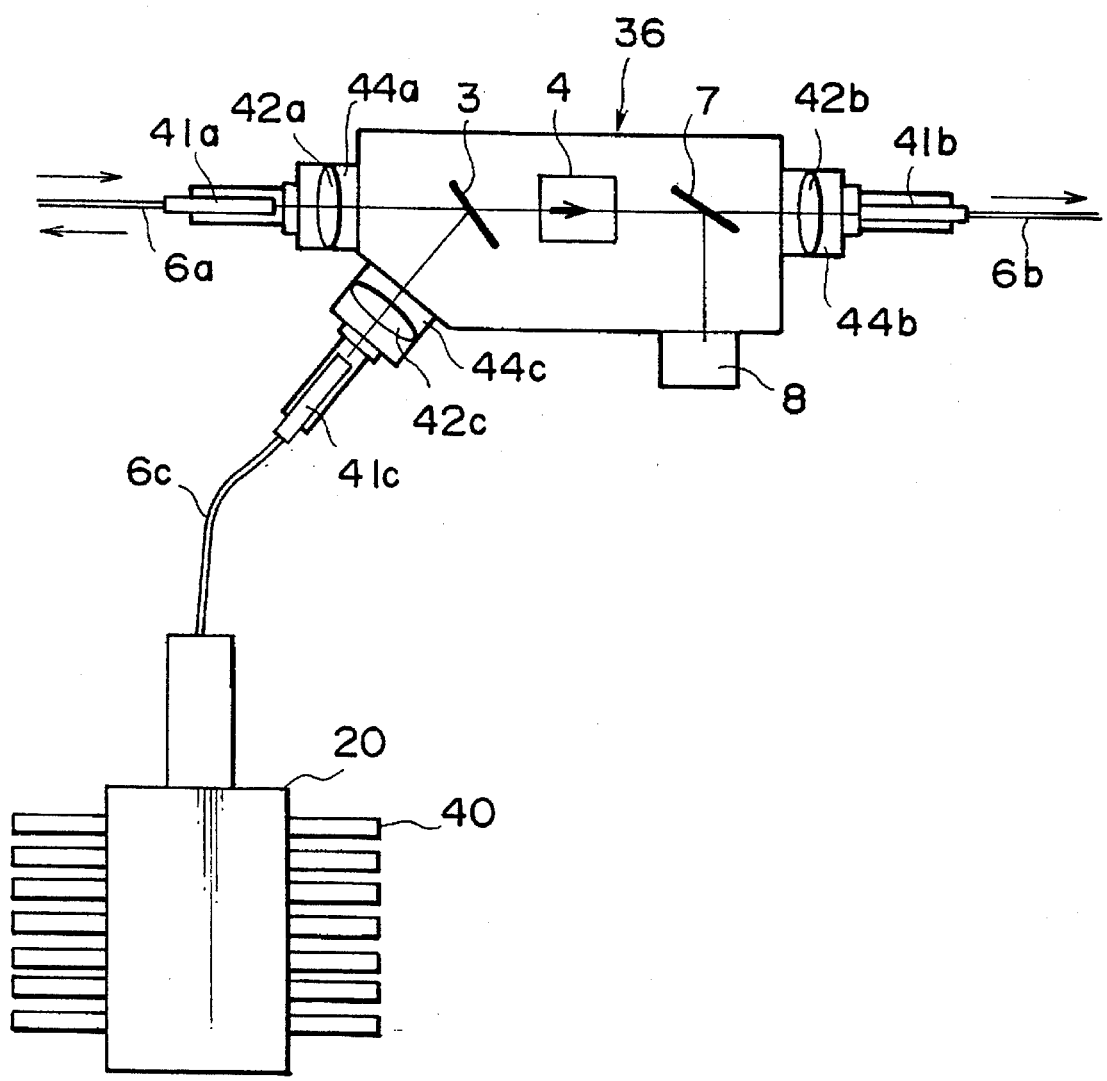
FIG. 24 is a schematic view showing a pumping module located on the rear stage of a conventional optical fiber amplifier.

FIGS. 8 and 9 are respectively a perspective view and a schematic plan view showing an optical composite module according to the eighth embodiment of the present invention. Referring to FIGS. 8 and 9, illustration of a cover on an optical base is omitted from FIG. 8, and illustration of a cover on a frame and the cover on the optical base is omitted from FIG. 9. The optical composite module in FIGS. 8 and 9 corresponds to a module obtained by hybrid integration of the function of the broken line portion in FIG. 23.

Referring to FIGS. 8 and 9, an optical base 45 has a recess portion 46 in which a carrier portion is formed for housing an optical plate, an optical isolator 59, and the like. A frame 48 for housing a pumping LD chip 52 and the like is mounted on the optical base 45. A cover 48a is mounted on the frame 48. Terminals 40 for electrical connections to an external circuit protrude from a side surface of the frame 48. Optical fibers 50 and 51 are respectively connected to lens holders 47a and 47b on side surfaces of the recess portion 46 through ferrules 49a and 49b. Lenses 61 and 58 are respectively stored in the lens holders 47a and 47b.

Pumping light (having a wavelength of, e.g., 1.48 μm) emitted from the pumping LD chip 52 is converted from divergent light into parallel or convergent light by a lens 53. Thereafter, the pumping light passes through a SWPF (Short Wave-length Pass Filter) 55 via a window member 54, and is reflected by two WDM filters 56 and 57. The light then passes through a lens 58 to be incident on the optical fiber 51.

Meanwhile, most part of amplified signal light (having a wavelength of, e.g., 1.55 μm) incident from an EDF (not shown) onto the optical fiber 51 is transmitted through the WDM filter 57, an optical isolator 59, and a beam splitter 60 to be incident on the optical fiber 50. Part (1 to 10%) of the signal light is reflected by the beam splitter 60 and is also reflected by a total reflection mirror 62. The light is then incident on a photodiode serving as an output monitor 97. In this embodiment, the output monitor 97 serves as an output monitor for an optical fiber amplifier.

The number of coatings is not specifically limited in the present invention. The WDM filter has the property of transmitting signal light and reflecting pumping light. In contrast to the WDM filter, the SWPF has a function of reflecting signal light and transmitting pumping light. Although the WDM filter transmits most of signal light, a small amount (e.g., −20 dB) of light component is reflected. This reflected light component reaches the LD chip first, and is then reflected by its emitting face. The light finally reaches the optical fiber and the EDF while being attenuated by the WDM filter. Even a small amount of signal light component reflected in this manner may degrade the characteristics of the optical fiber amplifier. In order to suppress such degradation, the SWPF is inserted to attenuate a leakage component of signal light in the optical path of pumping light. However, the SWPF may be omitted depending on the signal light reflecting characteristics at the WDM filter or the required characteristics of the optical fiber amplifier.

Each of optical plates such as a WDM filter, an SWPF, and a beam splitter is obtained by forming a dielectric multilayered film on a light-transmitting substrate, e.g., a glass material such as "BK7" (borosilicate crown glass). Such a plate is designed to have a predetermined reflectance and a predetermined transmittance with respect to light having a predetermined wavelength. However, the design performance cannot be obtained unless each plate is used at a predetermined incident angle. It is therefore very important for an optical composite module to hold these optical plates at predetermined angles.

[Ninth Embodiment]

Figure 10:
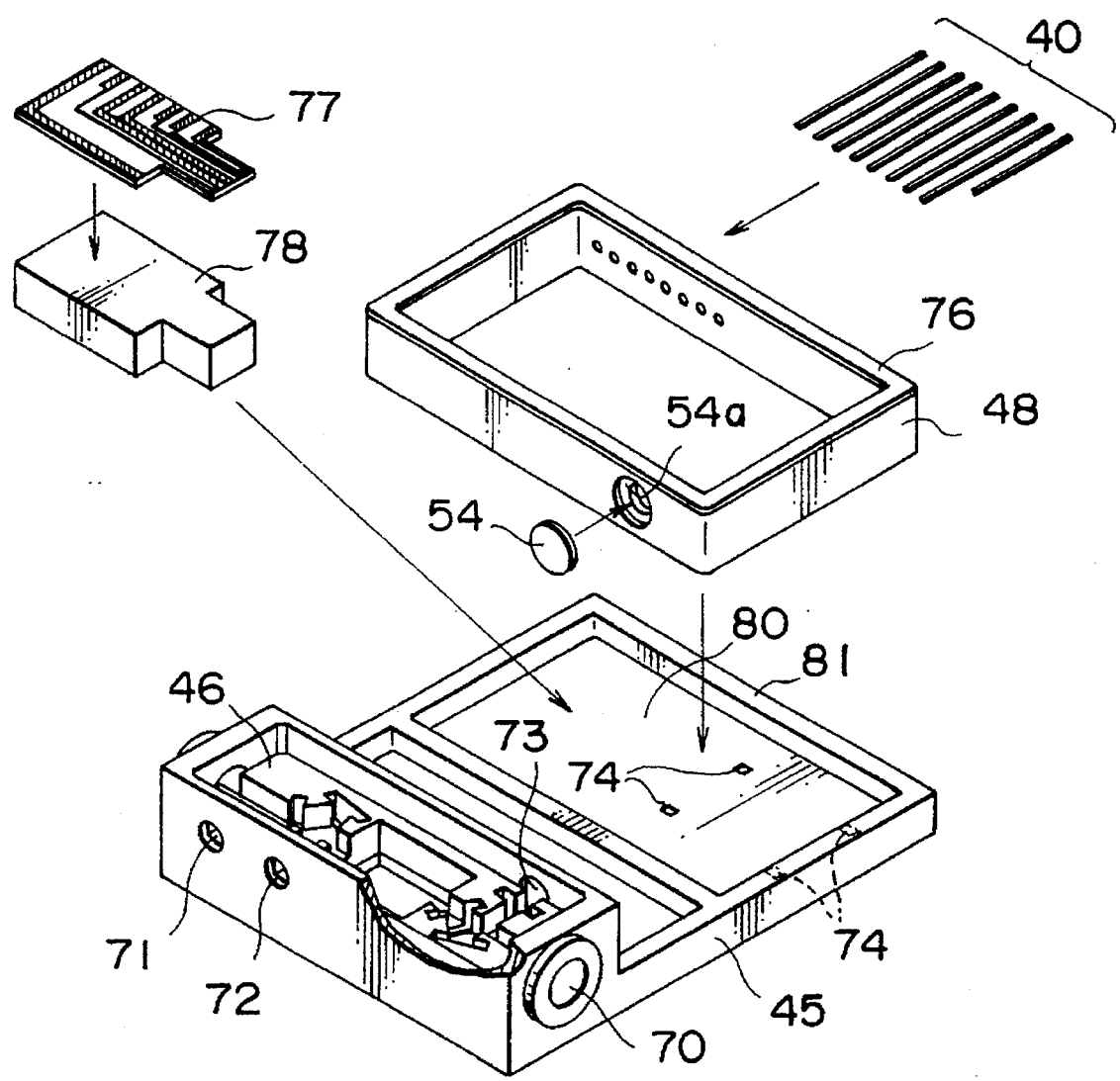
FIG. 10 is an exploded perspective view showing an optical base, a frame, and the like in FIG. 8.
Figure 11:
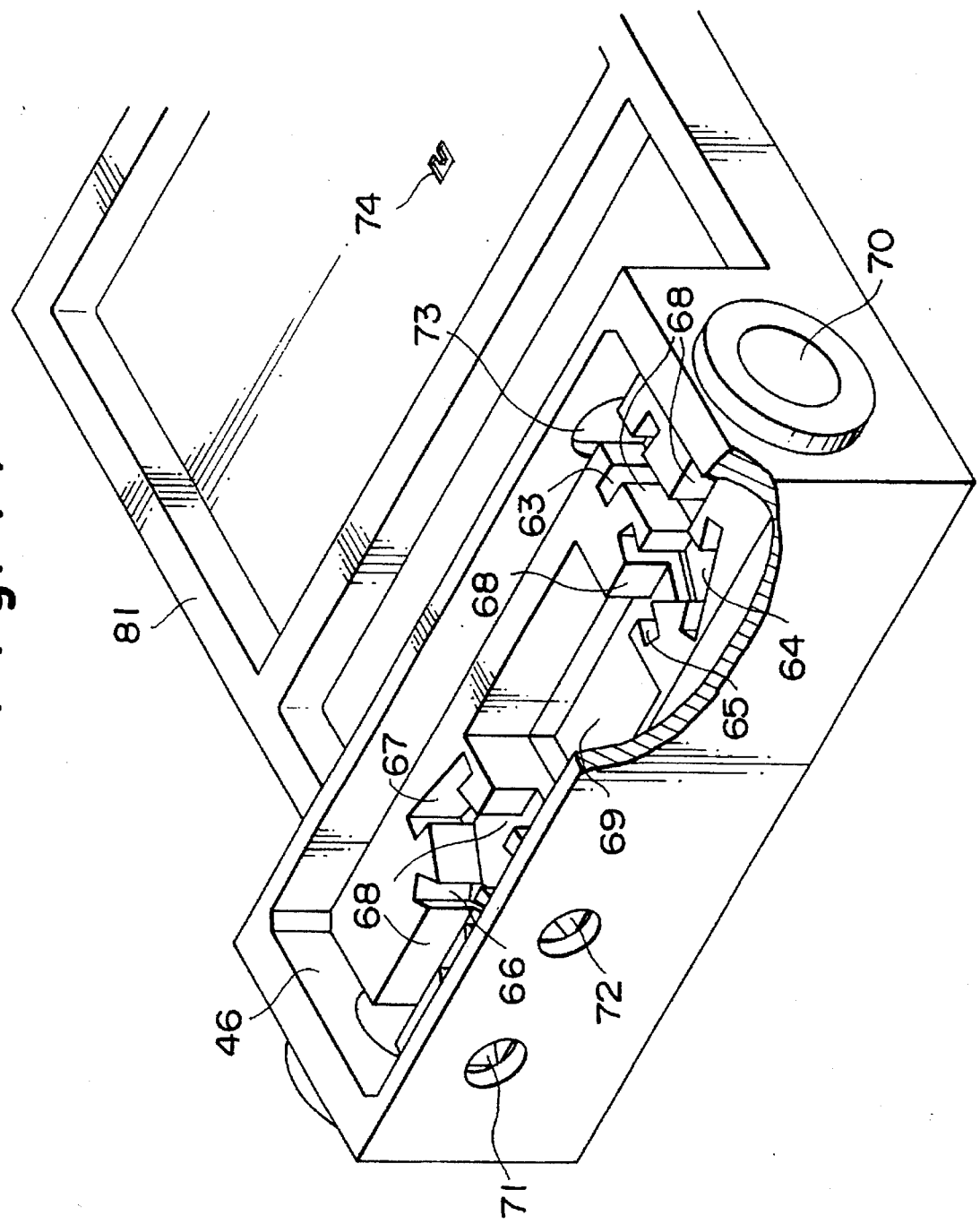
FIG. 11 is an enlarged perspective view showing the optical base in FIG. 10.

FIG. 10 is an exploded perspective view showing the optical base, the frame, and the like in FIG. 8. FIG. 11 is an enlarged perspective view showing an optical base. Referring to FIGS. 10 and 11, an optical base 45 is formed by injection molding using a metal material. A recess portion 46 of the optical base 45 has grooves 63 to 67 for housing an optical plate, a groove 68 for allowing light to be transmitted through, a groove 69 for housing an optical isolator 59, and holes 70 to 73 for allowing light to be transmitted through. Although the optical base 45 has such a complicated structure, the base can be manufactured with high precision and high reproducibility by injection molding. In addition, a marker 74 serves as a reference for positioning in mounting a Peltier element 75 (to be described later).

The respective members in FIG. 10 are mounted in the following manner. In this embodiment, in order to obtain a hermeticity of about $10^{-8}$ cc/sec, which varies depending on the required level of sealing performance of a pumping LD chip 52, the following pairs of members are brazed or soldered to each other: the optical base 45 and a frame 48; the frame 48 and a seal ring 76; a window member 54 and the frame 48; a spacer 78, on which a printed circuit substrate 77 is mounted, and the optical base 45; and the printed circuit substrate 77 and the spacer 78. Terminals (lead pins) 40 and the frame 48 are joined to each other with a low-melting glass material to ensure electrical insulation. If the required level of sealing performance is low, an organic resin may be used for the above joining.

A material with high weldability (e.g., Kovar) is used for the seal ring 76 on the assumption that a cover 48a (to be described later) is joined to the seal ring 76 by seam welding to ensure hermetically sealing. If, however, the frame 48 itself is made of a material with high weldability or the cover is to be mounted by a method other than welding, the seal ring is not required, and the cover 48a may be directly mounted on the frame 48. Alternatively, after the frame 48 and the optical base 45 are integrally formed by injection molding, the lead pin 40 and the window member 54 may be mounted. However, it is difficult to form a hole 54a as a mounting portion for the window member 54 by molding, unless the inner size of the frame 48 is sufficiently large. For this reason, in this embodiment, the frame 48 and the optical base 45 are formed as separate parts.

The spacer 78 is used to position the printed circuit substrate 77 in the direction of height so as to facilitate electrical connection between a printed circuit substrate 79 (to be described later), the lead pins 40, and the printed circuit substrate 77. However, the spacer 78 and the optical base 45 may be integrally formed. In addition, a rib 81 is formed on a flat plate portion 80 of the optical base 45. The rib 81 can be used for positioning in mounting the frame 48 on the optical base 45, and also has an effect of suppressing warping of the flat plate portion 80 which is relatively large in area and thin.

Figure 12:
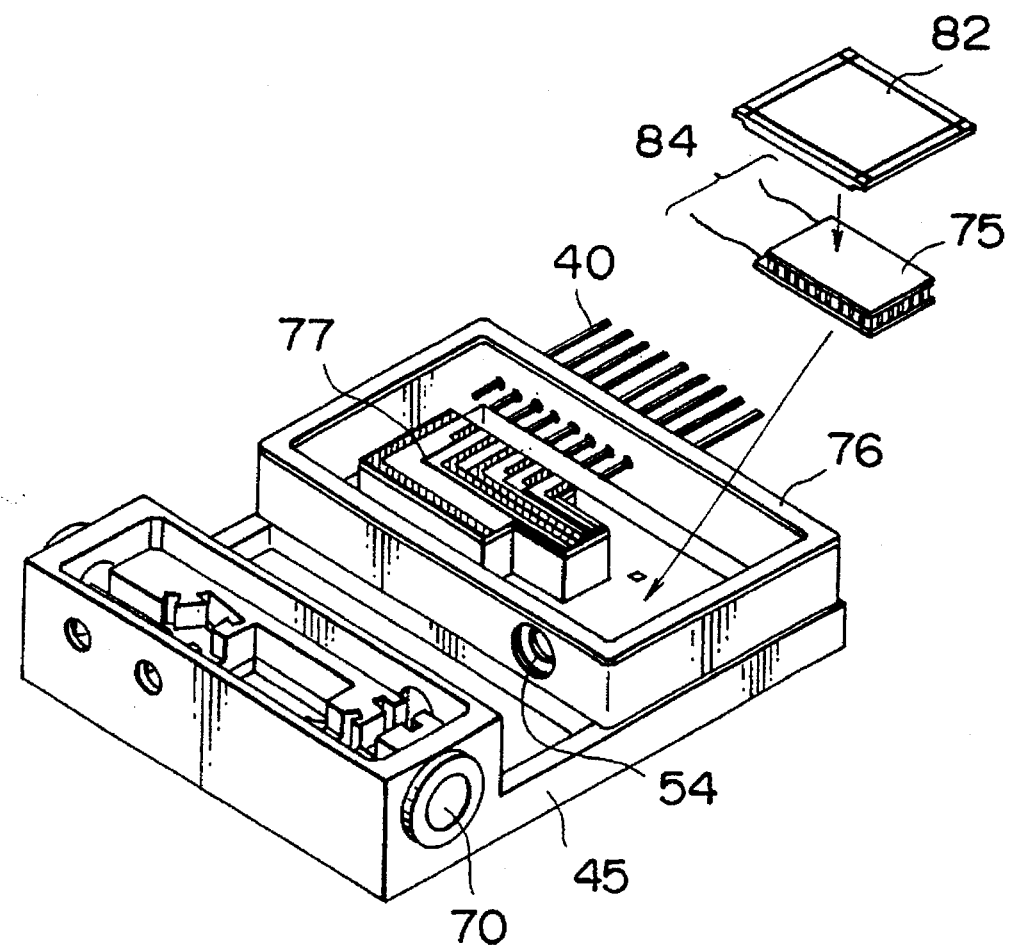
FIG. 12 is a perspective view showing a state wherein the frame and the like are mounted on the optical base.

After the frame 48, the printed circuit substrate 77, and the like are assembled as shown in FIG. 10, the Peltier element 75 and a spacer 82 are mounted on the flat plate portion 80 of the optical base 45 as shown in FIG. 12. These members are soldered to each other in consideration of heat conduction in particular. In this case, the spacer 82 is inserted because the difference in area between a saddle 83 (to be described later) and the Peltier element 75 is large. If, therefore, the difference in area between these members is relatively small, the spacer 82 may be omitted. After the Peltier element 75 described above is soldered, leads 84 are soldered to predetermined pads (not shown) of the printed circuit substrate 77.

Figure 13:
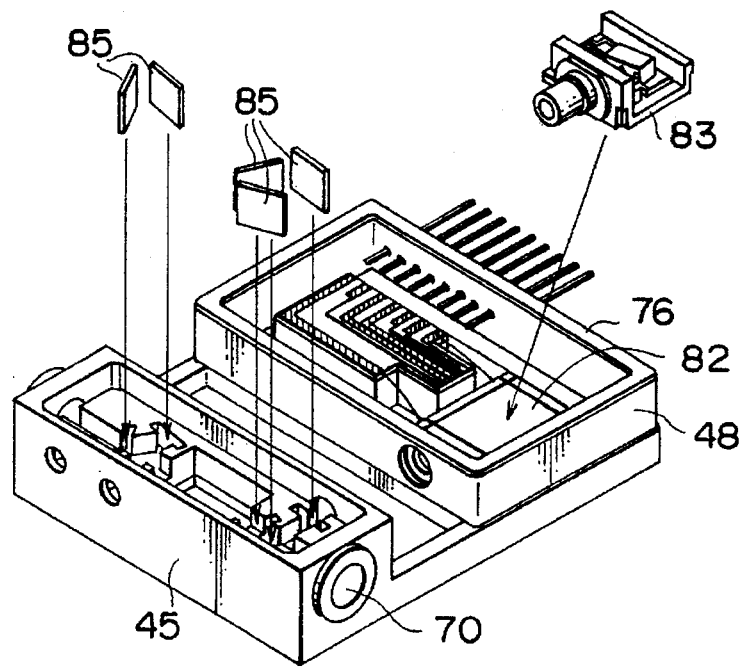
FIG. 13 is a perspective view showing a state wherein an optical plate is inserted in the optical base.

Subsequently, as shown in FIG. 13, an optical plate 85 is mounted on the optical base 45, and the saddle 83 is fixed on the spacer 82 by soldering. As described above, the optical plate 85 exhibits predetermined performance with respect to a predetermined incident angle. As the allowable range of incident angles is narrowed, an increase in the yield of the optical plate 85 and a reduction in the cost thereof can be expected. According to the present invention, since the grooves 63 to 67 in the optical base 45 can be formed with high precision, the angle of the optical plate 85 can be set with reference to the grooves 63 to 67. A predetermined angle precision may be obtained by sufficiently reducing the clearances between the grooves 63 to 67 and the optical plate 85. In this method, however, the thickness of the optical plate 85 must be strictly managed.

Figure 14:
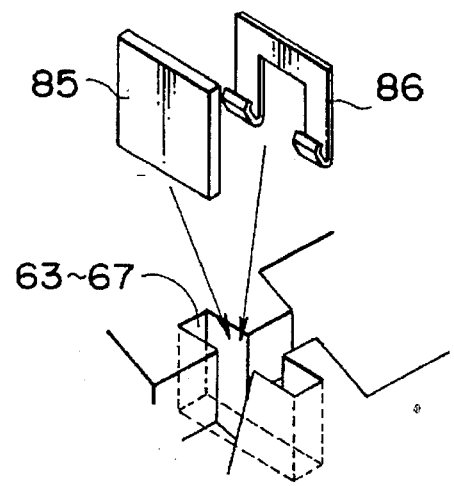
FIG. 14 is a perspective view showing a state wherein a leaf spring is inserted in a groove of the optical base.
Figure 15:
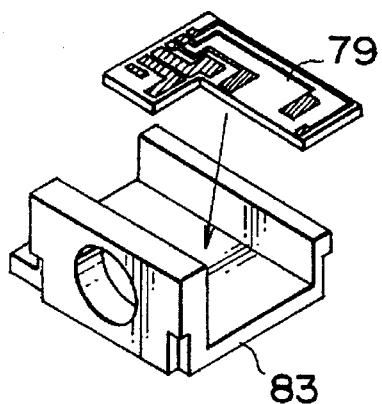
FIG. 15 is a perspective view showing a state wherein a printed circuit substrate is bonded to a saddle.
Figure 16:
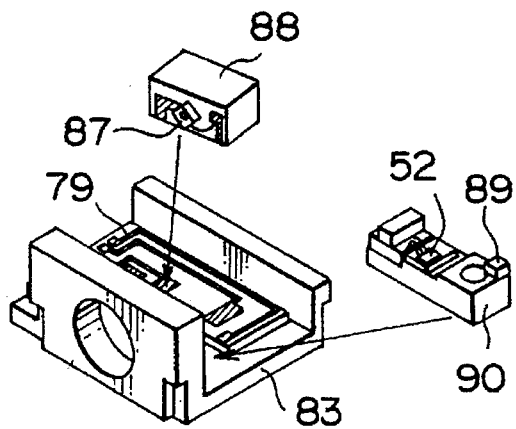
FIG. 16 is a perspective view showing a state wherein a chip carrier and the like are mounted on the saddle.

If a strict angle precision is required, the optical plate 85 is preferably inserted in the grooves 63 to 67 together with a leaf spring 86, as shown in FIG. 14. With this arrangement, even if the management of the thickness of the optical plate 85 is eased, the optical plate 85 can be mounted with an angle precision determined by the formation precision of the grooves 63 to 67. Note that the leaf spring 86 may be left as a fixing means in the final product. Alternatively, the optical plate 85 may be fixed in the grooves 63 to 67 with an adhesive or the like, and the leaf spring 86 may be used as a temporary fixing means until completion of fixing.

FIGS. 15 to 18 are perspective view showing the saddle 83 and parts to be mounted thereon. Referring to FIGS. 15 to 18, first of all, the printed circuit substrate 79 is mounted on the saddle 83 by soldering, brazing, or the like. Subsequently, a chip carrier 88 on which a PD chip 87 for monitoring pumping LD light is mounted is mounted on the printed circuit substrate 79, and a chip carrier 90 on which the pumping LD chip 52 and a thermistor 89 are mounted is mounted on the saddle 83.

Figure 17:
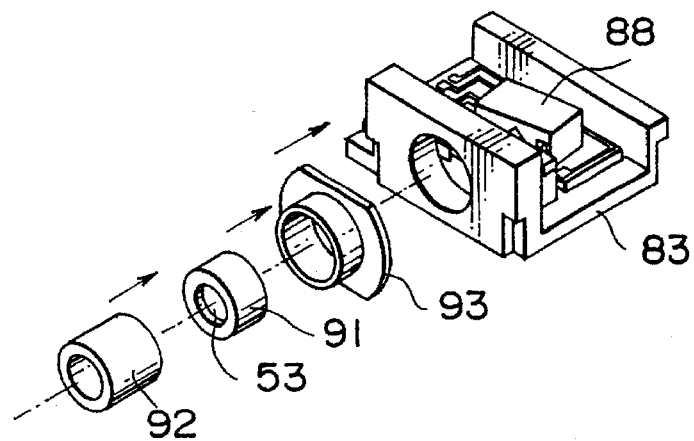
FIG. 17 is a perspective view showing a state wherein a lens barrel and the like are mounted on the saddle.
Figure 18:
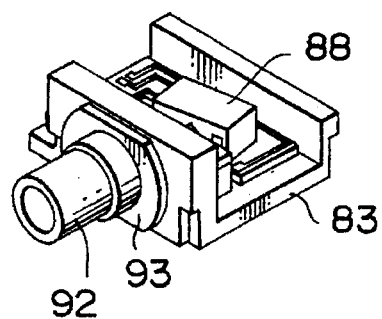
FIG. 18 is a perspective view showing the assembled saddle.

As shown in FIG. 17, the lens 53 held by a lens barrel 91 is mounted on the saddle 83 with an extended lens barrel 92 and a sleeve 93 while the positional relationship or the distance between the lens and the pumping LD chip 52 is adjusted such that light from the pumping LD chip 52 becomes a beam propagating in a predetermined direction with a predetermined focal length (which may be infinite, i.e., the light may be a parallel beam). In order to allow adjustment of such a positional relationship, the metal lens barrel 91 in which the lens 53 is mounted, and the metal sleeve 93 having an inner diameter slightly larger than the outer diameter of the lens barrel 91 are designed such that the lens barrel 91 is slidable in the sleeve 93. In addition, the extended lens barrel 92 is fixed to the lens barrel 91 in advance to facilitate handling of this structure in adjusting the position of the lens barrel 91. After the position and distance of the lens 53 are adjusted with this arrangement, the lens barrel 91, the sleeve 93, and the saddle 83 (the front surface) are fixed by laser welding.

In mounting the saddle 83 on the spacer 82 after this assembly process, the direction and position of the saddle 83 are adjusted such that pumping light from the pumping LD chip 52 emerges from almost the center of the hole 70 at a predetermined angle (almost perpendicular to a side surface of the optical base 45). More specifically, the saddle 83 is pressed with a jig (not shown), and the jig is moved on the micron order to a position where pumping light emerges in a predetermined direction. Thereafter, the saddle 83 is fixed with a low-melting point solder.

Figure 19:
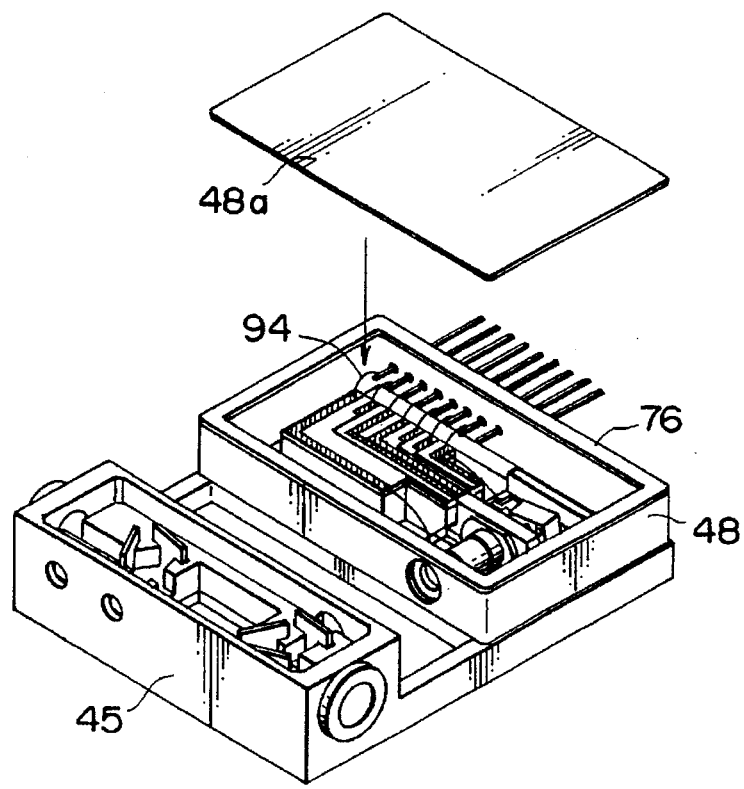
FIG. 19 is a perspective view showing a state wherein a cover is mounted on the frame.

After the optical plate 85 and the saddle 83 are mounted on the optical base 45 in the above manner, the printed circuit substrates 77 and 79 are electrically connected to lead pins with wires 94 by wire bonding. Furthermore, as shown in FIG. 19, the cover 48a is mounted on the frame 48 via the seal ring 76 in a dry nitrogen atmosphere by seam welding, thereby hermetically sealing the pumping LD chip 52 and the like.

Figure 20:
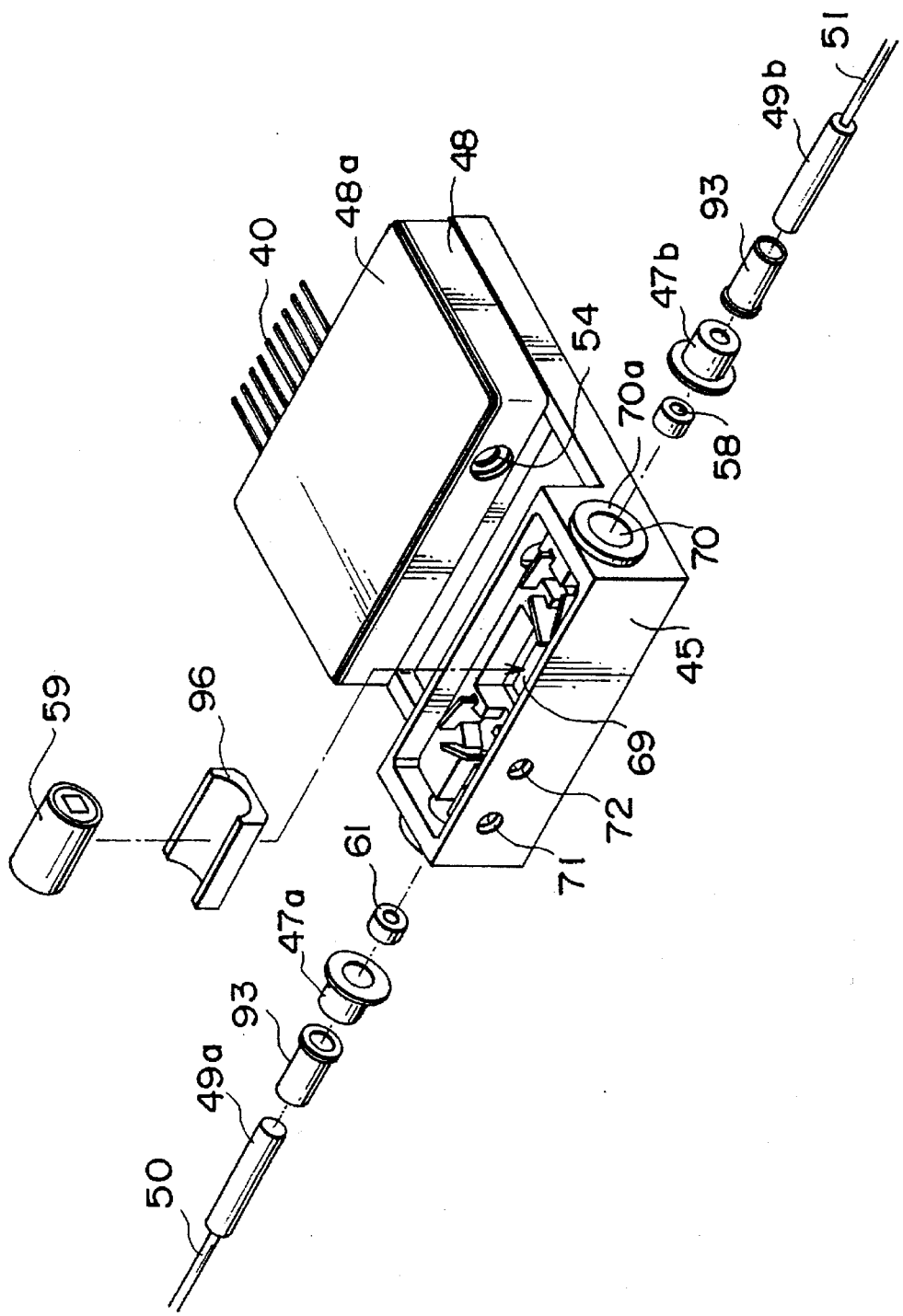
FIG. 20 is an exploded perspective view showing a state wherein an optical fiber is amounted on an optical base.
Figure 21:
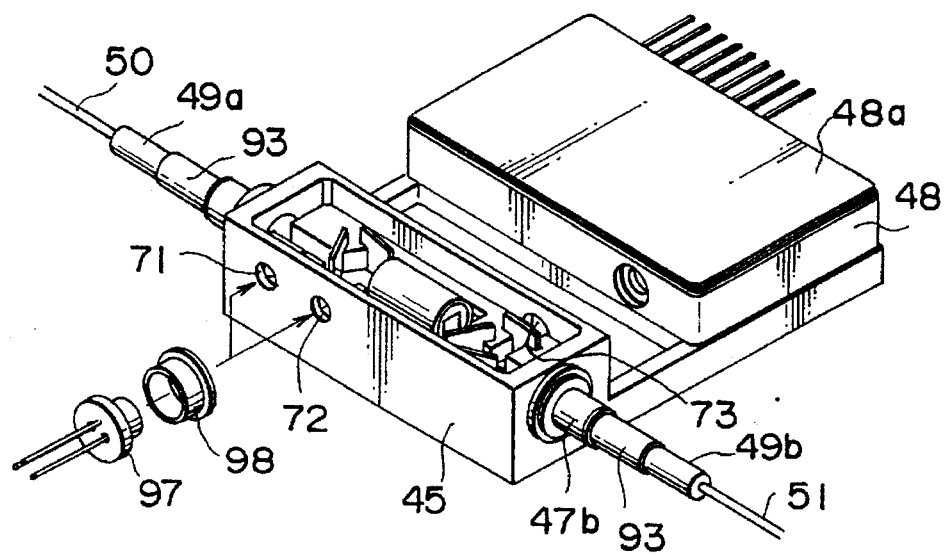
FIG. 21 is a perspective view showing a state wherein a monitor PD is mounted on a hole of the optical base.

As shown in FIG. 20, lenses 58 and 61 and optical fibers 50 and 51 are mounted on the optical base 45. In mounting these members, a lens barrel 95 in which the lenses 58 and 61 are mounted is housed in a lens holder 47b, the lenses 58 and 61 and the optical fibers 50 and 51 are aligned, and a hole joining surface 70a, the lens holder 47b, and the sleeve 93 are joined to each other by laser welding.

Subsequently, the optical isolator 59 is mounted on an isolator base 96. The isolator base 96 is mounted in the groove 69 formed in the recess portion 46 of the optical base 45. The light-transmitting area of the optical isolator 59, i.e., the sizes of a birefringent crystal and a Faraday rotator constituting the optical isolator, is preferably minimized to reduce the cost. The position of a signal light beam from the optical fiber 51 naturally varies to a certain level depending on the assembly precision of the module. In order to use an optical isolator of a low cost (i.e., having a small light-transmission area) even with such variations, the isolator base 96 is designed to be vertically and horizontally slidable in the groove 69. As is apparent, when an optical isolator having a sufficiently large light-transmitting area is to be used, a rectangular groove, a V-shaped groove, a U-shaped groove, or the like may be formed directly formed in the optical base to house the isolator. After the optical isolator 59 is mounted in the groove 69, the optical fiber 50 and the lens 61 are aligned to be satisfactorily coupled to signal light, and are fixed on the optical base 45.

A monitor PD 97 mounted on a cylindrical metal package is mounted on the hole 72 of the optical base 45 to receive some components of signal light which are reflected by the beam splitter 60 and a reflection mirror 62. Finally, in order to protect the optical plate 85 and the optical path of pumping light from dust, the entire optical composite module is covered with a cover, thereby completing the optical composite module.

The above embodiment exemplifies the optical composite module on the rear stage of a bidirectional pumping optical fiber amplifier. However, an optical composite module on the front stage can also be realized by the common members. That is, an optical composite module on the front stage can be assembled by reversing the direction of the optical isolator 59 and mounting the monitor PD 97 in the hole 71. Some optical composite module on the rear stage requires a reflection monitor PD for detecting reflected light generated when the connector on the light output side is removed. In this case, the monitor PD 97 may also be mounted in the hole 71 of the Optical composite module on the rear stage.

A prism may be used in place of the optical plate 85. For example, two WDM filters 56 and 57 and one SWPF 55 can be formed on the three surfaces of one prism. In this case, a groove may be formed on the optical base in accordance with the shape of the prism. A leaf spring can be effectively used for this structure as well. In addition, an optical composite module including no light-emitting element can be realized by the present invention. For example, such an optical composite module on the rear stage of a forward pumping optical fiber amplifier can be realized by removing the flat plate portion 80, the pumping LD chip 52 and the like mounted thereon, the WDM filters 56 and 57, and the SWPF 55 from the optical composite module according to the eighth embodiment. A pumping LD may be prepared as a separate module to supply pumping light to the optical composite module via an optical fiber. In this case, the flat plate portion 80 of the optical base 45 may be removed (FIGS. 10 and 11), and an optical fiber and a lens for supplying pumping light may be arranged at the position of the hole 73.

In the eighth and ninth embodiments, selection of a material for an optical base is important. That is, a material for an optical base should be selected in consideration of the following items:

(1) Small expansion coefficient: When a light-emitting element, a Peltier element, and the like are to be mounted on the optical base, members having relatively small linear expansion coefficients, e.g., ceramic materials, are often mounted on the base. In this case, a material having a linear expansion coefficient similar to the linear expansion coefficients of these members is preferably used for the base to prevent deformation and peeling upon joining of the members. Even if a light-emitting element, a Peltier element, and the like are not mounted, the us&. of a material having a small linear expansion coefficient is effective in preventing misalignment of an optical axis due to thermal strain.

(2) High thermal conductivity: This is important especially when a light-emitting element, a Peltier element, and the like are to be mounted on the optical base. When a pumping LD for emitting light having a wavelength of 1.48 μm is used, heat corresponding to 1 to 1.5 W is generated by the pumping LD chip alone. At a high temperature, 1.5 to 2.5 W is added, as heat generated by the Peltier element, to the above heat. Therefore, in order to sufficiently sink such heat, a material having a high thermal conductivity is preferable.

(3) High rigidity: In order to prevent an optical loss which is caused when misalignment of an optical axis occurs owing to deformation caused by an external force, a material having a high rigidity (high Young's modulus) is preferable. High rigidity is preferable especially when the optical base has a flat plate portion having a relatively large area on which a light-emitting element and the like are mounted.

(4) Weldability: In fixing a lens, an optical fiber, and the like, laser welding with high assembly reliability is generally used. Therefore, a material which allows laser welding is preferably used for the optical base.

Different materials are selected depending on priorities given to the above four terms. Table 1 shows materials suitable for the optical base.

TABLE 1

|  | Linear Expansion Coefficient ($10^{-6} \cdot °C^{-1}$) | Thermal Conductivity (W/m · K) | Young's Modulus ($10^3$ kg/mm$^2$) | Laser Weldability |
|---|---|---|---|---|
| Tungsten | 4.5 | 167 | 39 | possible |
| Cu20W80 | 8.3 | 200 | 29 | difficult |
| Kovar | 5.3 | 17 | 14 | good |
| Stainless Steel | 11.0 | 26 | 20 | good |

For an optical composite module including no light-emitting element, a priority is given to term (4), and hence Kovar or stainless steel is preferable. For optical composite module including a light-emitting element and a Peltier element, priorities are given to terms (1) to (3), and hence tungsten or a copper/tungsten alloy (e.g., Cu20W80) is preferable. When metal material containing tungsten as a main component (indicated as "tungsten" in Table 1) is to be used, since it is a refractory material, laser welding of this material requires relatively high laser energy. The material preferably contains tungsten 90 wt. % or more and may be contained nickel as a minor component. In fixing a lens or an optical fiber, the laser energy is preferably minimized, because a positional error on the micron order influences an optical loss.

Figure 22:
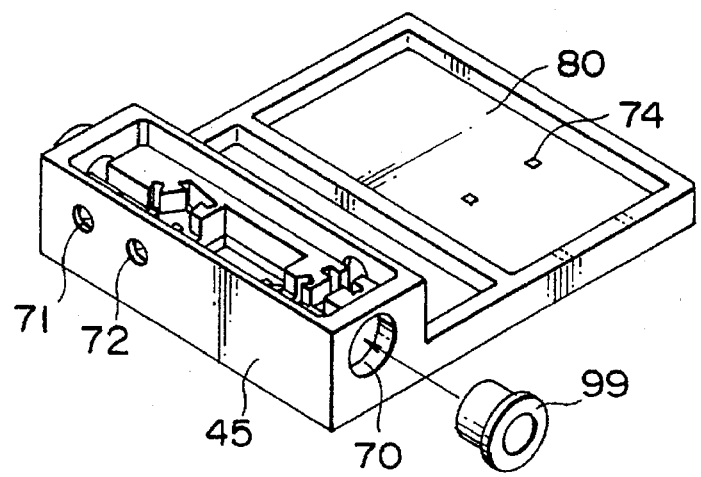
FIG. 22 is a perspective view showing a state wherein a cylindrical member is mounted in a hole of the optical base.

When a copper/tungsten alloy is to be used, welding is difficult to perform. In this case, as shown in FIG. 22, a cylindrical member 99 made of a material having high weldability, e.g., stainless steel or Kovar, may be mounted in the hole 70 of the optical base 45 in advance, and the lens holder 47b or the like may be welded to the member 99. In mounting the cylindrical member 99, strict position precision is not required. The cylindrical member 99 can therefore be mounted by laser welding with high energy, brazing, press fitting, or the like. Furthermore, similar cylindrical members may be mounted in the holes 71 and 72 used for mounting PDs.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 006332/1995 (7-006332) filed on Jan. 19, 1995 is hereby incorporated by reference.

What is claimed is:

1. An optical composite module comprising:

a housing having two opposing side surfaces;

a light separating unit disposed in said housing for separating pumping light and signal light;

optical fibers respectively mounted on the opposing side surfaces of said housing to cause the signal light to pass through said light separating unit on a substantially straight line; and a pumping light source unit disposed in said housing for subjecting the pumping light to incident on said light separating unit.

2. A module according to claim 1, wherein said pumping light source unit is disposed to cause emitted pumping light to be incident in a direction perpendicular to a traveling direction of signal light passing through said light separating unit, and said light separating unit comprises a mirror for reflecting the pumping light incident from said pumping light source unit, and a multiplexer for transmitting the reflected pumping light in an opposite direction to the traveling direction of the signal light.

3. A module according to claim 1, wherein said pumping light source unit is disposed to cause emitted pumping light to propagate parallel to a traveling direction of signal light passing through said light separating unit, and further comprising a mirror for reflecting the pumping light emitted from said pumping light source unit to cause the light to be incident in a direction perpendicular to said light separating unit, and said light separating unit comprises a mirror for reflecting the pumping light incident from said pumping light source unit, and a multiplexer for transmitting the reflected pumping light in an opposite direction to the traveling direction of the signal light.

4. A module according to claim 1, wherein said pumping light source unit is disposed with an inclination with respect to a traveling direction of signal light passing through said light separating unit, pumping light emitted from said pumping light source unit is incident on said light separating unit with an inclination, and said light separating unit further comprising a multiplexer for transmitting the incident pumping light in an opposite direction to the traveling direction of the signal light.

5. A module according to claim 1, wherein said light separating unit further comprising an optical isolator.

6. A module according to claim 1, wherein said light separating unit further comprising a beam splitter disposed in an optical path of signal light, and a photodiode disposed in a traveling direction of the signal light.

7. A module according to claim 1, wherein said pumping light source unit comprises a semiconductor laser, a photodiode disposed therebehind, and a temperature controller for adjusting temperature around said semiconductor laser.

8. A module according to claim 1, wherein said pumping light source unit further comprising an optical isolator.

* * * * *